(12) United States Patent
Kozaka et al.

(10) Patent No.: US 7,851,904 B2
(45) Date of Patent: Dec. 14, 2010

(54) SEMICONDUCTOR DEVICE, METHOD FOR MANUFACTURING THE SAME, AND SEMICONDUCTOR DEVICE MOUNTING STRUCTURE

(75) Inventors: Yukihiro Kozaka, Kyoto (JP); Yoshifumi Nakamura, Osaka (JP); Michinari Tetani, Osaka (JP)

(73) Assignee: Panasonic Corporation, Osaka (JP)

( * ) Notice: Subject to any disclaimer, the term of this patent is extended or adjusted under 35 U.S.C. 154(b) by 499 days.

(21) Appl. No.: 11/950,625

(22) Filed: Dec. 5, 2007

(65) Prior Publication Data

US 2008/0136017 A1    Jun. 12, 2008

(30) Foreign Application Priority Data

Dec. 6, 2006 (JP) ............................. 2006-329641
Oct. 17, 2007 (JP) ............................. 2007-270538

(51) Int. Cl.
*H01L 23/10* (2006.01)
*H01L 23/58* (2006.01)

(52) U.S. Cl. ................. 257/706; 257/702; 257/713; 257/790; 257/E23.101

(58) Field of Classification Search .............. 257/706, 257/702, 713, 790, E23.101
See application file for complete search history.

(56) References Cited

U.S. PATENT DOCUMENTS

| 5,083,191 | A | * | 1/1992 | Ueda ......................... 257/783 |
| 5,157,478 | A | * | 10/1992 | Ueda et al. ................... 257/796 |
| 5,414,299 | A | * | 5/1995 | Wang et al. ................... 257/702 |
| 5,731,631 | A | * | 3/1998 | Yama et al. ................... 257/702 |
| 5,977,633 | A | * | 11/1999 | Suzuki et al. ................ 257/738 |
| 6,097,085 | A | * | 8/2000 | Ikemizu et al. ............... 257/678 |
| 6,249,046 | B1 | * | 6/2001 | Hashimoto ................... 257/691 |
| 6,380,620 | B1 | * | 4/2002 | Suminoe et al. .............. 257/706 |

FOREIGN PATENT DOCUMENTS

JP        10-41428        2/1998

* cited by examiner

*Primary Examiner*—Nitin Parekh

(57) ABSTRACT

A semiconductor device of the present invention includes: a wiring board 4 in which a conductive wiring 6 is formed on an insulating substrate 5 having an opening 5a; a semiconductor element 2 that has a circuit forming region 2a and an electrode pad 3, and is mounted on the wiring board with the circuit forming region facing the opening, the electrode pad being connected electrically to the conductive wiring via a protruding electrode 3a; a sealing resin 7 that covers the connected portion between the electrode pad and the conductive wiring; a heat dissipating member 9 that is disposed so as to have a portion facing the opening; and a filling material 8 that has a heat conductivity higher than that of the sealing resin, and is filled into the opening, so as to be in contact with the circuit forming region of the semiconductor element and the heat dissipating member. Even when the wiring board has a small area, heat dissipation efficiency can be ensured, and low cost manufacture can be achieved.

6 Claims, 15 Drawing Sheets

SEMICONDUCTOR DEVICE, METHOD FOR MANUFACTURING THE SAME, AND SEMICONDUCTOR DEVICE MOUNTING STRUCTURE

BACKGROUND OF THE INVENTION

1. Field of the Invention

The present invention relates to a semiconductor device having improved heat dissipation, a method for manufacturing the same, and a semiconductor device mounting structure.

2. Description of Related Art

Along with an increase in the level of integration of integrated circuits and progress in size reduction of semiconductor elements in recent years, demand is growing for mounting techniques that can be employed to connect terminals arranged at narrow pitches. As the mounting structures that can satisfy this demand, TAB (Tape Automated Bonding), which is utilized for TCPs (Tape Carrier Packages), COG (Chip On Glass), which utilizes an anisotropic conductive film (ACF), COF (Chip On Film) and BOF (Bump On Film) are known.

These mounting structures have a basic configuration in which a protruding electrode called a bump is formed, using Au or solder, on each electrode pad of a semiconductor element, and the bumps on the semiconductor element are bonded at the same time to a metal wiring formed on a resin tape or glass substrate. However, in the case of BOF (Bump On Film), the protruding electrodes are formed on the metal wiring of a resin tape, and the electrode pads of the semiconductor element are bonded at the same time to the protruding electrodes.

The power consumption per unit volume of integrated circuits that employ the above-described mounting techniques is increasing along with an increase in the level of integration of integrated circuits, and therefore some semiconductor devices including such integrated circuits adopt measures against heat generation (see JP H10-41428A, for example).

FIG. 20 is a cross-sectional view illustrating the configuration of a semiconductor device that employs TAB as the mounting structure and takes measures against heat generation. On the main surface (i.e., the surface having the circuit forming region, the upper surface in FIG. 20) of a semiconductor element 101, protruding electrodes 102 are formed. A conductive wiring 104 patterned on a wiring board 103 is connected electrically to the protruding electrodes 102. The connected portions between the conductive wiring 104 and the protruding electrodes 102, and the main surface of the semiconductor element 101 are covered with a sealing resin 105. Further, an organic insulating material 111, such as polyimide or epoxy resin, for example, is provided on one of the surfaces of the wiring board 103, so as to cover an extending portion of the conductive wiring 104.

In a heat dissipating member 107, a recessed portion 110 is formed, and the semiconductor element 101 is disposed in the recessed portion 110. A filing material 106 is filled in the recessed portion 110 on the side that faces the back surface (the lower surface in FIG. 20) that is opposite to the main surface of the semiconductor element 101. This causes the back surface of the semiconductor element 101 to connect to the inner wall surface of the recessed portion 110 of the heat dissipating member 107 via the filling material 106.

Also, the conductive wiring 104 that is connected to the protruding electrodes 102 for grounding of the semiconductor element 101 is connected electrically to the heat dissipating member 107 via a conductive screw 108. Furthermore, the wiring board 103 and the heat dissipating member 107 are attached to each other with double-sided tape 109.

With this configuration, the heat generated at the main surface during operation of the semiconductor element 101 is transmitted from the back surface of the semiconductor element 101 through the filling material 106 to the heat dissipating member 107, where the heat is released into the air.

In addition, because a signal to the ground terminal from the semiconductor element 101 is transmitted from the protruding electrodes 102 through the conductive wiring 104 and the conductive screw 108 to the heat dissipating member 107, sufficient grounding can be effected, reducing noise and EMI (electromagnetic interference).

However, conventional semiconductor devices as shown in FIG. 20 have the problem that when the area of the wiring board 103 on which the conductive wiring 104 is formed is reduced for decreasing a size of the devices, the size of the heat dissipating member 107 also needs to be reduced, lowering the heat dissipation efficiency.

SUMMARY OF THE INVENTION

It is an object of the present invention to solve the problem described above and provide a semiconductor device that is low in cost and can ensure heat dissipation efficiency even when the wiring board has a small area, and a method for manufacturing the semiconductor device, and a semiconductor device mounting structure.

In order to solve the above-described problem, a semiconductor device according to the present invention includes: a wiring board in which a conductive wiring is formed on an insulating substrate having an opening; a semiconductor element that has a circuit forming region and an electrode pad, and is mounted on the wiring board with the circuit forming region facing the opening. The electrode pad is connected electrically to the conductive wiring via a protruding electrode. A sealing resin covers the connected portion between the electrode pad and the conductive wiring. A heat dissipating member is disposed so as to have a portion facing the opening. A filling material that has a heat conductivity higher than that of the sealing resin is filled into the opening, so as to be in contact with the circuit forming region of the semiconductor element and the heat dissipating member.

A semiconductor device mounting structure according to the present invention includes: a semiconductor device including a wiring board in which a conductive wiring is formed on an insulating substrate having an opening, a semiconductor element that has a circuit forming region and an electrode pad, and is mounted on the wiring board with the circuit forming region facing the opening. The electrode pad is connected electrically to the conductive wiring via a protruding electrode, and a sealing resin covers the connected portion between the electrode pad and the conductive wiring. A heat dissipating member is disposed so as to have a portion facing the opening. A filling material that has a heat conductivity higher than that of the sealing resin is filled into the opening, so as to be in contact with the circuit forming region of the semiconductor element and the heat dissipating member.

A method for manufacturing a semiconductor device according to the present invention is to manufacture a semiconductor device in which a semiconductor element having a circuit forming region and an electrode pad is mounted on a wiring board that has a conductive wiring formed on an insulating substrate with an opening. The method includes the steps of aligning an end portion of the conductive wiring and the electrode pad portion of the semiconductor element by arranging the circuit forming region and the opening such that the circuit forming region and the opening face each other; connecting the conductive wiring and the electrode pad via a protruding electrode that is formed on either of the conductive wiring or the electrode pad; applying a sealing resin onto the connected portion between the conductive wiring and the electrode pad, and curing the sealing resin while the circuit forming region is exposed; applying a heat conductive material onto the exposed circuit forming region; and placing a heat dissipating member on the wiring board, and bringing the heat conductive material and the heat dissipating member into tight contact.

According to the above-described configuration in which the filling material filled in the opening of the wiring board is in contact with the circuit forming region of the semiconductor element and the heat dissipating member, the heat dissipation efficiency from the circuit forming region can be improved. Even when the wiring board has a small area, sufficient heat dissipation efficiency can be ensured, providing an inexpensive semiconductor device and/or a semiconductor device mounting structure.

DETAILED DESCRIPTION OF THE INVENTION

The present invention is able to adopt modes such as the following, based on the foregoing configurations.

In the semiconductor device having the above configuration, the heat dissipating member may be a sheet. Alternatively, the heat dissipating member may be a metal plate.

It is preferable that the heat dissipating member is made of a material having a higher heat conductivity than that of the filling material.

As the filling material, it is possible to use any one of a solder alloy, resin, a resin containing a metal, silicone, rubber or a resin containing inorganic particles.

Also, it is preferable that the circuit forming region is provided with an insulating protective film.

In the semiconductor device mounting structure having the above-described configuration, the heat dissipating member may be a chassis. Alternatively, the heat dissipating member may be a part of a housing.

As the filling material, it is possible to use any one of a solder alloy, resin, a resin containing a metal, silicone, rubber or a resin containing inorganic particles.

Also, it is preferable that the circuit forming region is provided with an insulating protective film.

Hereinafter, embodiments of the semiconductor device of the present invention will be described with reference to the accompanying drawings.

Embodiment 1

Figure 1A:
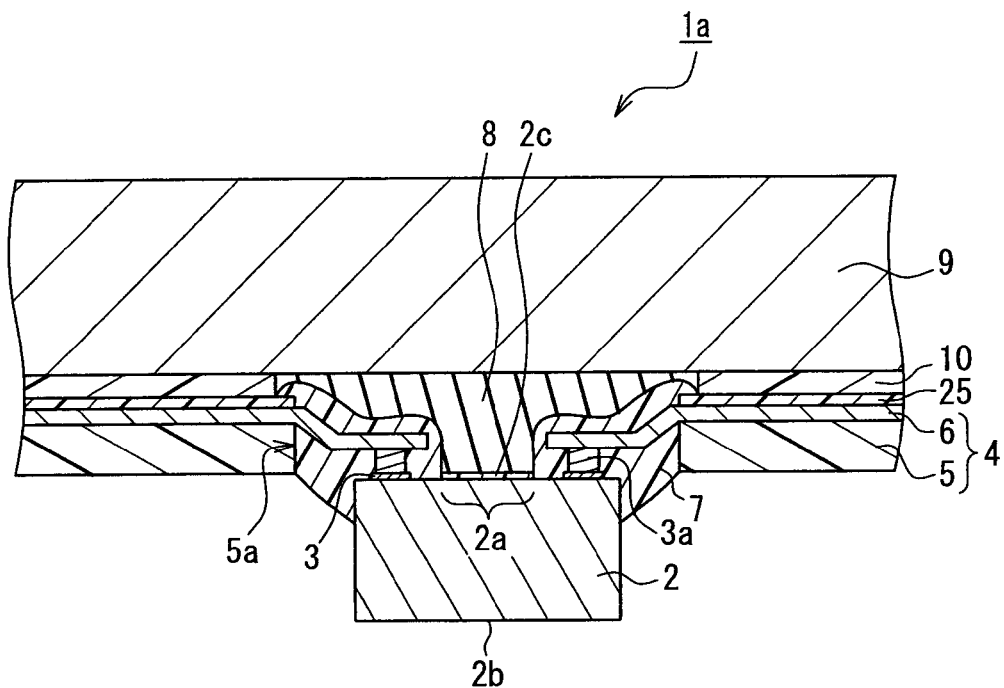
FIG. 1A is a cross-sectional view illustrating the configuration of a semiconductor device according to Embodiment 1 of the present invention.

FIG. 1A is a cross-sectional view illustrating the configuration of a semiconductor device 1a according to Embodiment 1 of the present invention.

A semiconductor element 2 has a circuit forming region (a region of the main surface in which a circuit is formed) 2a. On electrode pads 3 arranged around the circuit forming region 2a, protruding electrodes 3a are formed. The protruding electrodes 3a are formed of, for example, Au or a material in which Ni is covered with Au. It should be noted that the indication of the electrode pads 3 sometimes is omitted in the other drawings.

A wiring board 4 has a configuration in which, for example, a conductive wiring 6 is patterned on an insulating substrate 5 composed mainly of polyimide. In the insulating substrate 5, an opening 5a that is larger than the main surface of the semiconductor element 2 is formed. The conductive wiring 6 is composed of a conductive layer formed by vapor deposition or the like, and has a structure in which, for example, a patterned Cu wiring is covered with Sn, Au or the like. The conductive wiring 6 extends to the inside of the opening 5a of the insulating substrate 5. Further, an organic insulating material 25, such as polyimide or epoxy resin, for example, is provided on one of the surfaces of the wiring board 4, so as to cover an extending portion of the conductive wiring 6.

As described above, this semiconductor device 1a has a face-up structure in which the circuit forming region 2a of the semiconductor element 2 faces the surface of the wiring board 4 on which the conductive wiring 6 is not formed.

The semiconductor element 2 is disposed in the opening 5a of the wiring board 4, and the protruding electrodes 3a and the conductive wiring 6 are connected electrically. In order to ensure the electrical stability of connected portions between the conductive wiring 6 and the protruding electrodes 3a and the periphery of the connected portions, the connected portions and their periphery thereof are covered with an insulating sealing resin 7 such as an epoxy-based resin. The circuit forming region 2a of the semiconductor element 2 is in contact with a filing material 8 serving as a heat conductive material.

Onto the back surface of the conductive wiring 6, which is opposite to the surface that is fixed to the insulating substrate 5, a heat dissipating member 9 formed of, for example, Al is attached with double-sided tape 10 serving as an adhesive. The heat dissipating member 9 has a flat surface, and the flat surface is in contact with the filling material 8. Accordingly, the flat surface of the heat dissipating member 9 and the exposed surface of the circuit forming region 2a of the semiconductor element 2 are coupled thermally by the filling material 8.

As the material for the filling material 8, for example, a solder alloy, resin, a resin containing metal particles, silicone, rubber, a resin containing inorganic particles, or the like can be used, and the heat conductivity (not less than 1.5 W/mK) is higher than that (0.6 W/mK) of the sealing resin 7. However, when using a conductive filling material 8 such as a solder alloy or a resin containing metal particles, it is necessary to form an insulating protective film 2c on the circuit forming region 2a.

Also, it is preferable that the heat dissipating member 9 is formed of a material, such as Al, having a heat conductivity higher than that of the filling material 8. As the heat dissipating member 9, a metal plate can be used, for example.

During operation of the semiconductor element 2, the circuit forming region 2a generates a heat, so as to have the highest in temperature. If the heat dissipating member 9 having a high heat conductivity can be brought into contact with the circuit forming region 2a, the highest heat dissipation efficiency can be achieved. However, when the protruding electrodes 3a are formed on the same surface of the semiconductor element 2 on which the circuit forming region 2a is formed, structurally, it is difficult to bring the heat dissipating member 9 into contact with the circuit forming region 2a.

On the other hand, when the connected portions between the conductive wiring 6 and the protruding electrodes 3a, and the entire circuit forming region 2a are covered with the sealing resin 7 so as to couple the heat dissipating member 9 with the circuit forming region 2a via the sealing resin 7, the heat dissipation will be insufficient, because the sealing resin 7 has a low heat conductivity.

Figure 20:
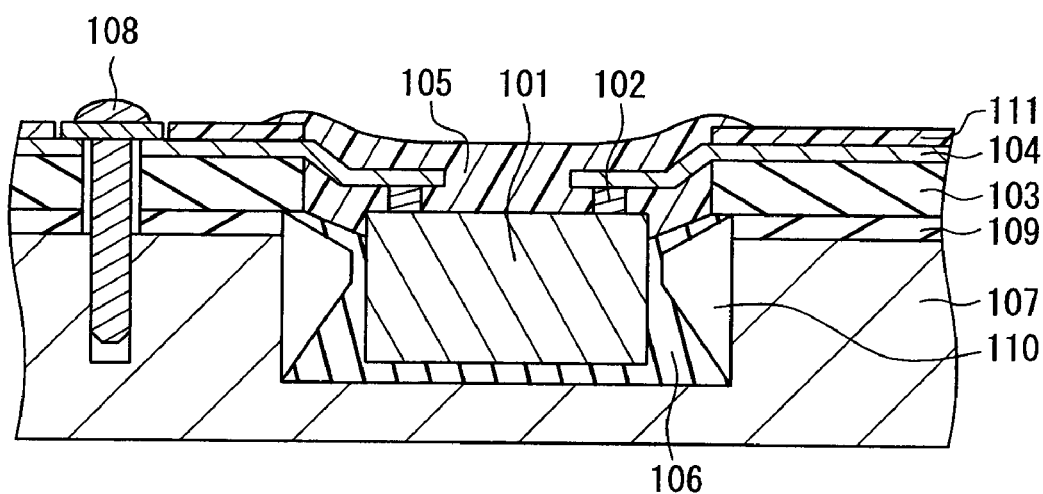
FIG. 20 is a cross-sectional view illustrating the configuration of a conventional semiconductor device.

According to the conventional configuration of the semiconductor device shown in FIG. 20, the heat generated at the main surface (the surface having the circuit forming region) of the semiconductor element 101 is transmitted to the back surface of the semiconductor element 101, then the filing material 106 and finally to the heat dissipating member 107. Because the main surface is covered with the sealing resin 105 having a low heat conductivity (0.6 W/mK), the main heat dissipation path extends only on one side, that is, from the semiconductor element 101 through the filling material 106 to the heat dissipating member 107. This lowers the heat dissipation efficiency.

In contrast, according to the configuration of the semiconductor device 1a of this embodiment, the heat generated at the circuit forming region 2a of the semiconductor element 2 is transmitted directly to the filling material 8 having a high heat conductivity, and then to the heat dissipating member 9. Because the filling material 8 has a heat conductivity higher than that of the sealing resin 7, the filling material 8 can transmit the heat generated at the circuit forming region 2a efficiently to the heat dissipating member 9. The heat transmitted to the heat dissipating member 9 is released into the air from the entire heat dissipating member 9.

As described above, the semiconductor device 1a according to this embodiment employs a configuration in which the filling material 8 is provided between the circuit forming region 2a and heat dissipating member 9, so that it is possible to improve heat dissipation efficiency. In addition, by leaving the back surface 2b of the semiconductor element 2, which is located opposite to the circuit forming region 2a, uncovered, the heat can be released into the air from the back surface 2b as well. By bringing the back surface 2b of the semiconductor element 2 into contact with a heat dissipating member or heat dissipating sheet, the heat can be released more efficiently.

Figure 1B:
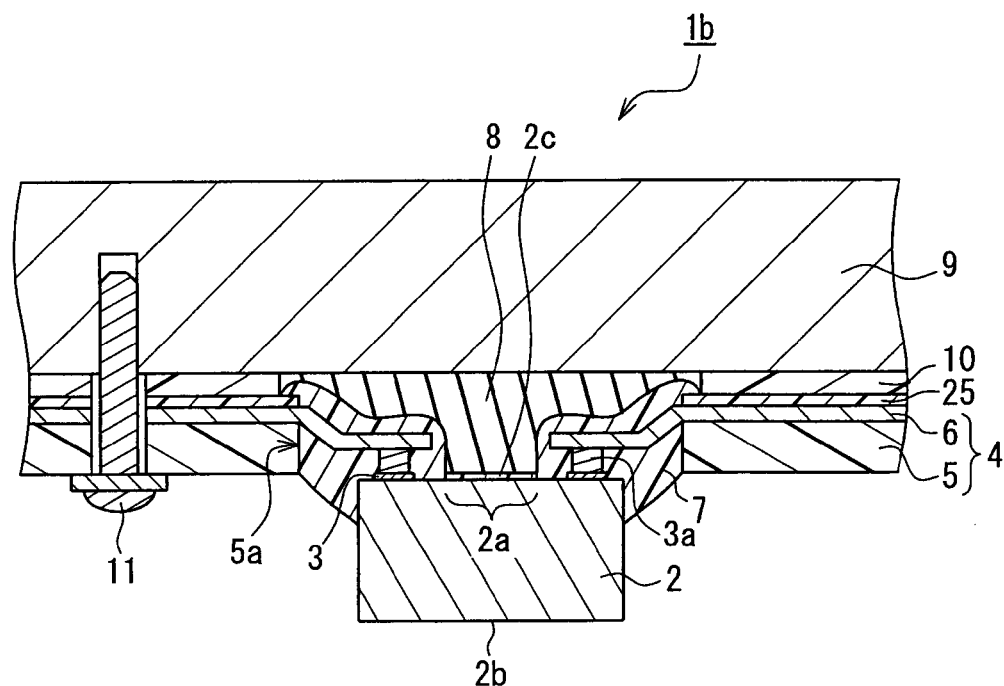
FIG. 1B is a cross-sectional view illustrating another configuration of the semiconductor device according to Embodiment 1.

FIG. 1B is a cross-sectional view illustrating the configuration of a variation of the semiconductor device according to this embodiment. A semiconductor device 1b has the same configuration as that of the semiconductor device 1a except that a conductive screw 11 that extends from the wiring board 4 to the heat dissipating member 9 is provided. Therefore, the same reference numerals are given to the same elements as those of the semiconductor device 1a, and the explanation is not repeated. The conductive wiring 6 connected to the protruding electrodes 3a for grounding of the semiconductor element 2 is connected to the heat dissipating member 9 by the conductive screw 11. Because the conductive wiring for grounding is connected to the heat dissipating member 9, sufficient grounding is effected, reducing noise and EMI, and at the same time, the heat generated in the semiconductor element 2 is transmitted from the conductive wiring 6 to the heat dissipating member 9 via the conductive screw 11.

Figure 2:
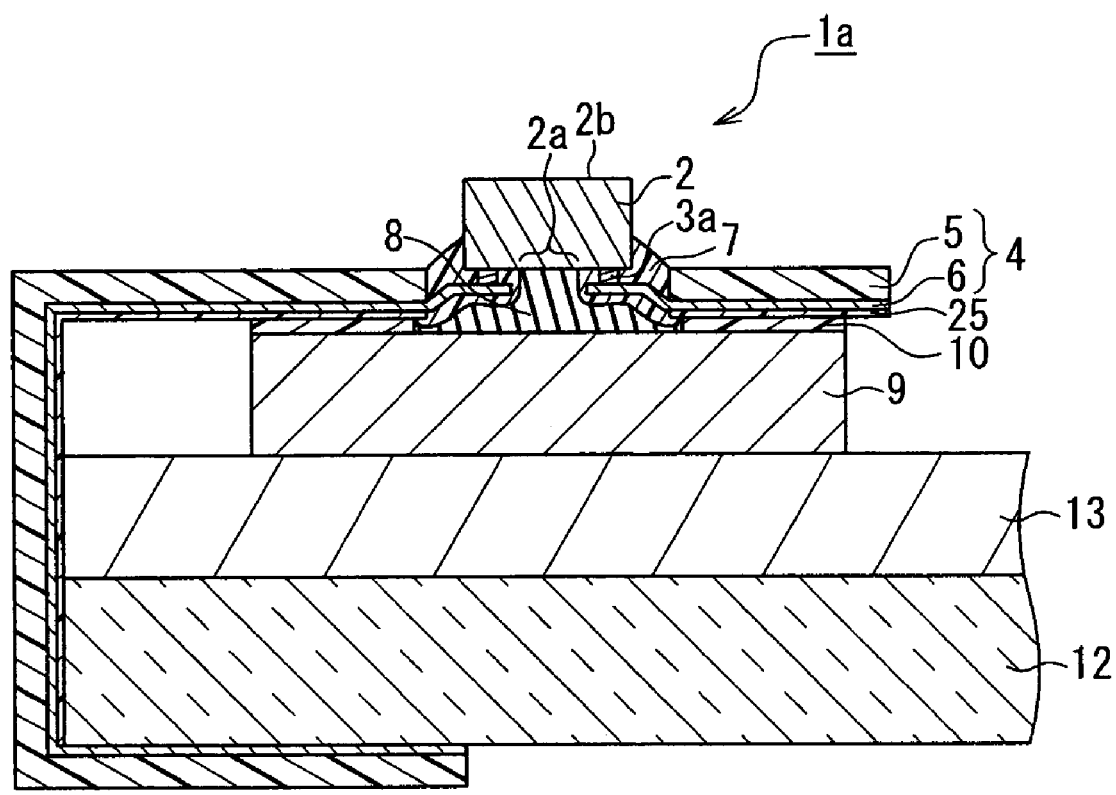
FIG. 2 is a cross-sectional view illustrating the mounting structure of the semiconductor device shown in FIG. 1A.

FIG. 2 is a cross-sectional view illustrating the mounting structure of the semiconductor device 1a. A chassis 13 is placed on a glass panel 12 such as a liquid crystal display. The semiconductor device 1a is disposed such that the circuit forming region 2a faces the glass panel 12. The heat dissipating member 9 is in contact with the chassis 13 of the glass panel 12, so the heat from the semiconductor element 2 is transmitted to the chassis 13. The conductive wiring 6 is connected to the glass panel 12.

Next, a method for manufacturing the semiconductor device 1b according to this embodiment will be described with reference to FIG. 1B and FIGS. 3A to 3E. FIGS. 3A to 3E are cross-sectional views illustrating the manufacturing steps of the semiconductor device 1b.

Figure 3A:
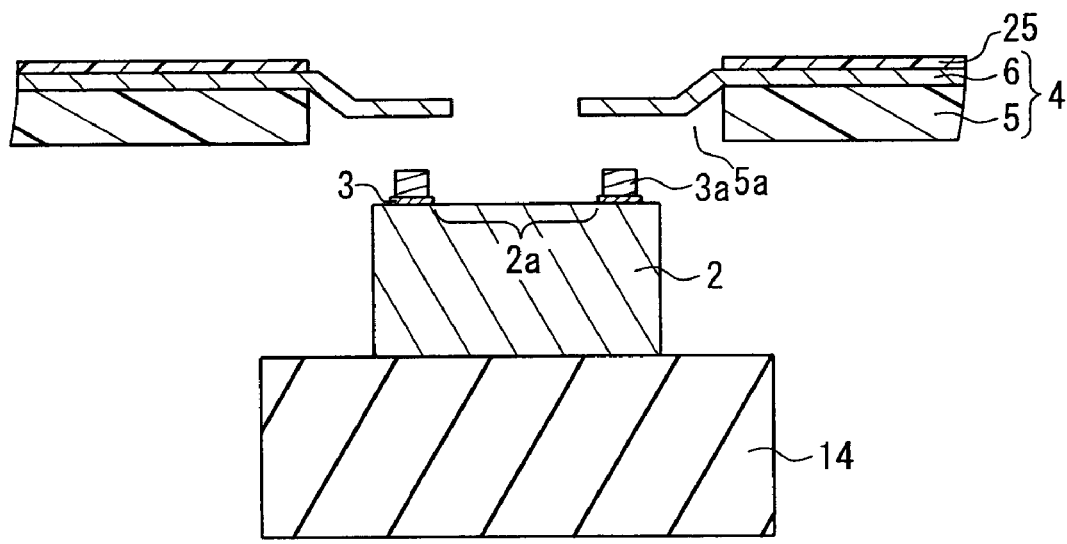
FIG. 3A is a cross-sectional view illustrating a manufacturing step of the semiconductor device according to Embodiment 1 of the present invention.

First, as shown in FIG. 3A, the semiconductor element 2 is placed on a bonding stage 14. Then, the wiring board 4 having an opening 5a and the conductive wiring 6 formed thereon is placed above the semiconductor element 2, such that the protruding electrodes 3a of the semiconductor element 2 and the conductive wiring 6 extending to the opening 5a are aligned.

Figure 3B:
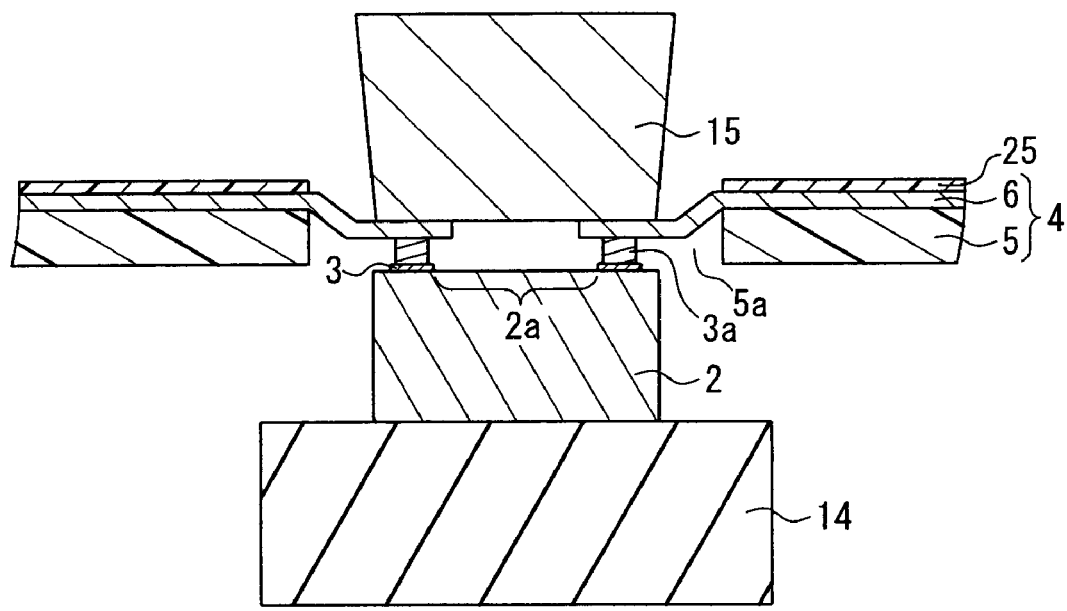
FIG. 3B is a plan view illustrating a step subsequent to that shown in FIG. 3A.

Subsequently, as shown in FIG. 3B, a bonding tool 15 is disposed on the conductive wiring 6 to bring the protruding electrodes 3a and the conductive wiring 6 into contact with each other, and sandwich the conductive wiring 6 between the bonding tool 15 and the protruding electrodes 3a. Then, heat, a load or ultrasonic vibration is applied between the protruding electrodes 3a and the conductive wiring 6. This causes the Au of the surface of the protruding electrodes 3a and the Sn or Au of the surface of the conductive wiring 6 to be bonded together by eutectic or metallic bonding. The bonding stage 14 and the bonding tool 15 are formed with a stainless steel material or ceramic material.

Figure 3C:
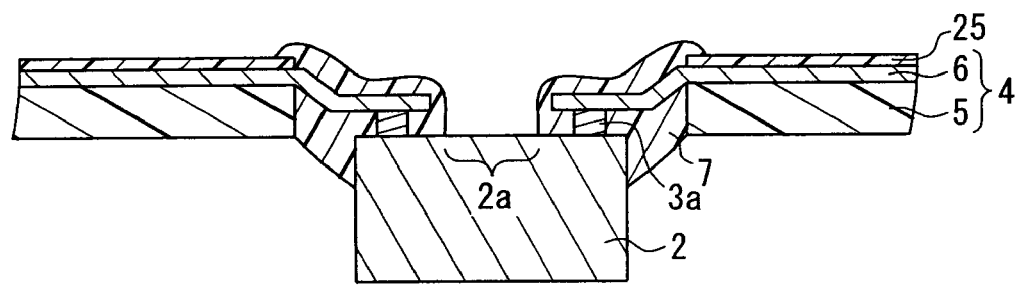
FIG. 3C is a plan view illustrating a step subsequent to that shown in FIG. 3B

Then, as shown in FIG. 3C, the sealing resin 7 is dropped so as to be applied onto the semiconductor element 2 and cover the connected portions of the conductive wiring 6 and the protruding electrodes 3a and the periphery of the connected portions. The circuit forming region 2a of the semiconductor element 2 is exposed. In this state, a heat treatment is applied to the sealing resin 7 for curing.

Figure 3D:
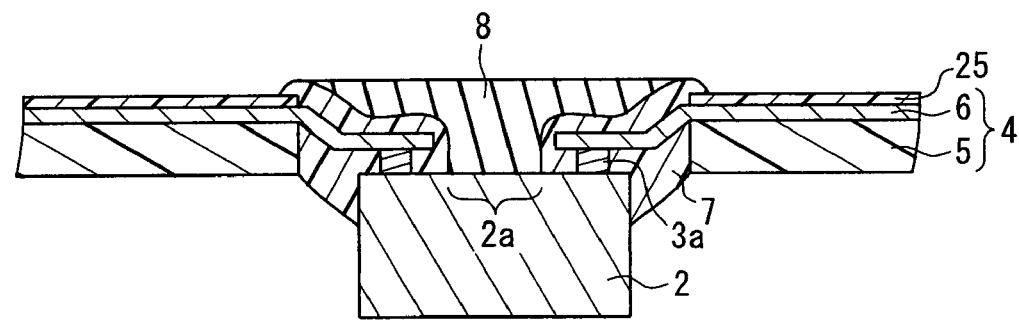
FIG. 3D is a plan view illustrating a step subsequent to that shown in FIG. 3C.
Figure 3E:
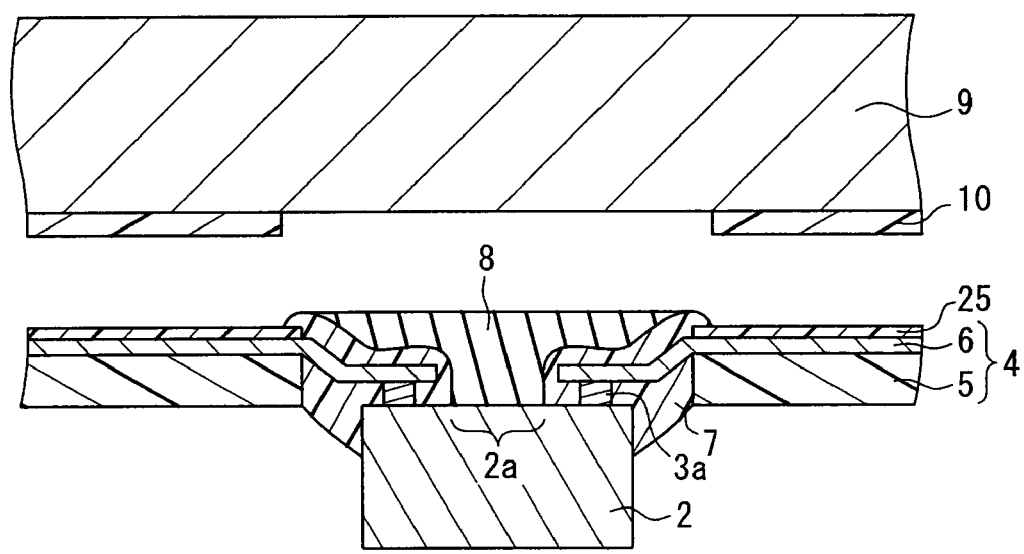
FIG. 3E is a plan view illustrating a step subsequent to that shown in FIG. 3D.

Next, as shown in FIG. 3D, the filling material 8 is applied onto the exposed circuit forming region 2a of the semiconductor element 2. Thereafter, as shown in FIG. 3E, the heat dissipating member 9 is attached, using double-sided tape 10, onto the surface of the wiring board 4 on which the conductive wiring 6 is provided, to cause the heat dissipating member 9 and the filling material 8 to be contacted closely with each other.

Finally, as shown in FIG. 1B, the wiring board 4 and the heat dissipating member 9 are firmly fixed with the conductive screw 11. Thus, the semiconductor device 1b is manufactured.

As described above, in the semiconductor devices 1a and 1b according to this embodiment, the circuit forming region 2a, which generates heat, of the semiconductor element 2 and the heat dissipating member 9 for dissipating heat are coupled by the filling material 8, improving heat dissipation efficiency. In addition, in the case of the semiconductor device 1b, the conductive wiring 6 for grounding and the heat dissipating member 9 are connected by the conductive screw 11, so that noise and EMI can be reduced, and the heat dissipation effect can be improved also.

Embodiment 2

Figure 4:
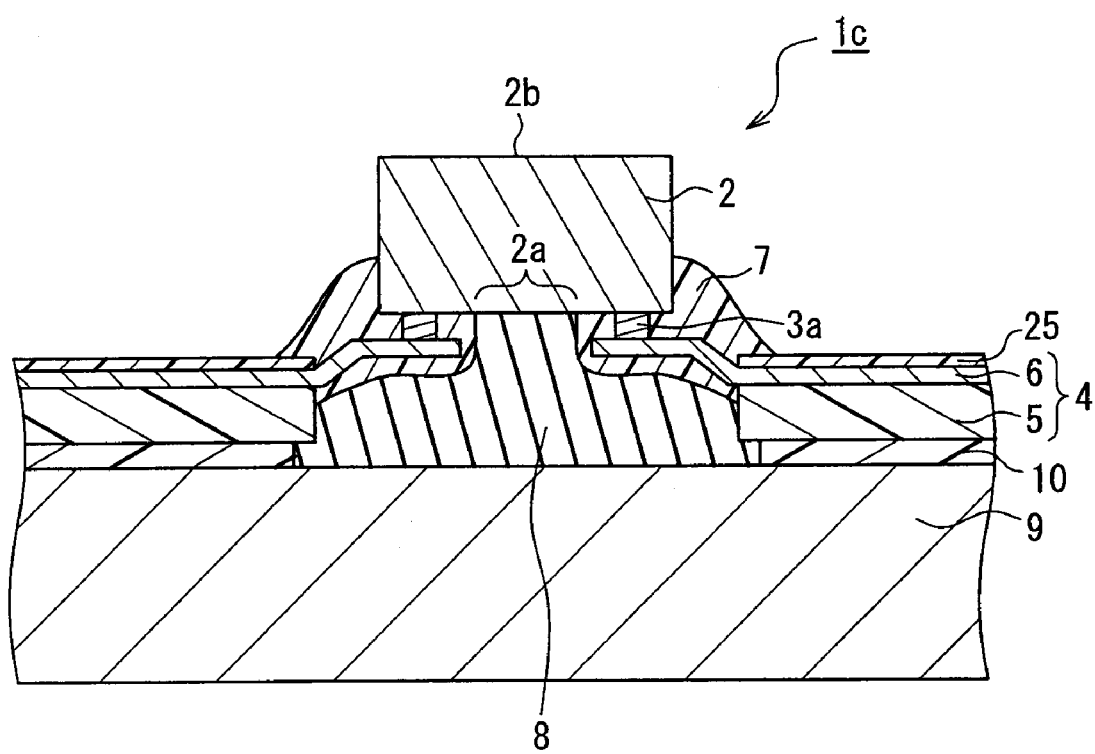
FIG. 4 is a cross-sectional view illustrating the configuration of a semiconductor device according to Embodiment 2 of the present invention.

FIG. 4 is a cross-sectional view illustrating the configuration of a semiconductor device 1c according to Embodiment 2 of the present invention. This semiconductor device 1c has a face-down structure in which the circuit forming region 2a of the semiconductor element 2 faces the surface of the wiring board 4 on which the conductive wiring 6 is formed. In other words, the semiconductor device 1c differs from the semiconductor device 1a of Embodiment 1 in that the conductive wiring 6 is located opposite to the heat dissipating member 9 relative to the wiring board 4. Onto the back surface of the wiring board 4 that is opposite to the surface on which the conductive wiring 6 is formed, the heat dissipating member 9 is attached with double-sided tape 10. The semiconductor device 1c has the same configuration as that of the semiconductor device 1a of Embodiment 1 except for the above-mentioned difference. Therefore, the same reference numerals are given to the same elements as those of the semiconductor device 1a, and the explanation is not repeated.

According to the above-described configuration, the heat generated at the circuit forming region 2a of the semiconductor element 2 is transmitted to the filling material 8 having a high heat conductivity, and then to the heat dissipating member 9. The filling material 8 has a heat conductivity higher than that of the sealing resin 7, so that the filling material 8 can transmit the heat generated in the circuit forming region 2a efficiently. The heat transmitted to the heat dissipating member 9 is released into the air from the entire heat dissipating member 9.

The heat generated in the semiconductor element 2 is transmitted also to the conductive wiring 6 through the protruding electrodes 3a, and then released into the air from the conductive wiring 6, improving the heat dissipation efficiency.

In addition, by leaving the back surface 2b of the semiconductor element 2, which is located opposite to the circuit forming region 2a, uncovered, heat can be released into the air from the back surface 2b as well. Furthermore, by bringing the back surface 2b of the semiconductor element 2 into contact with a heat dissipating member, heat dissipating sheet, housing or the like, heat can be released more efficiently.

Figure 5:
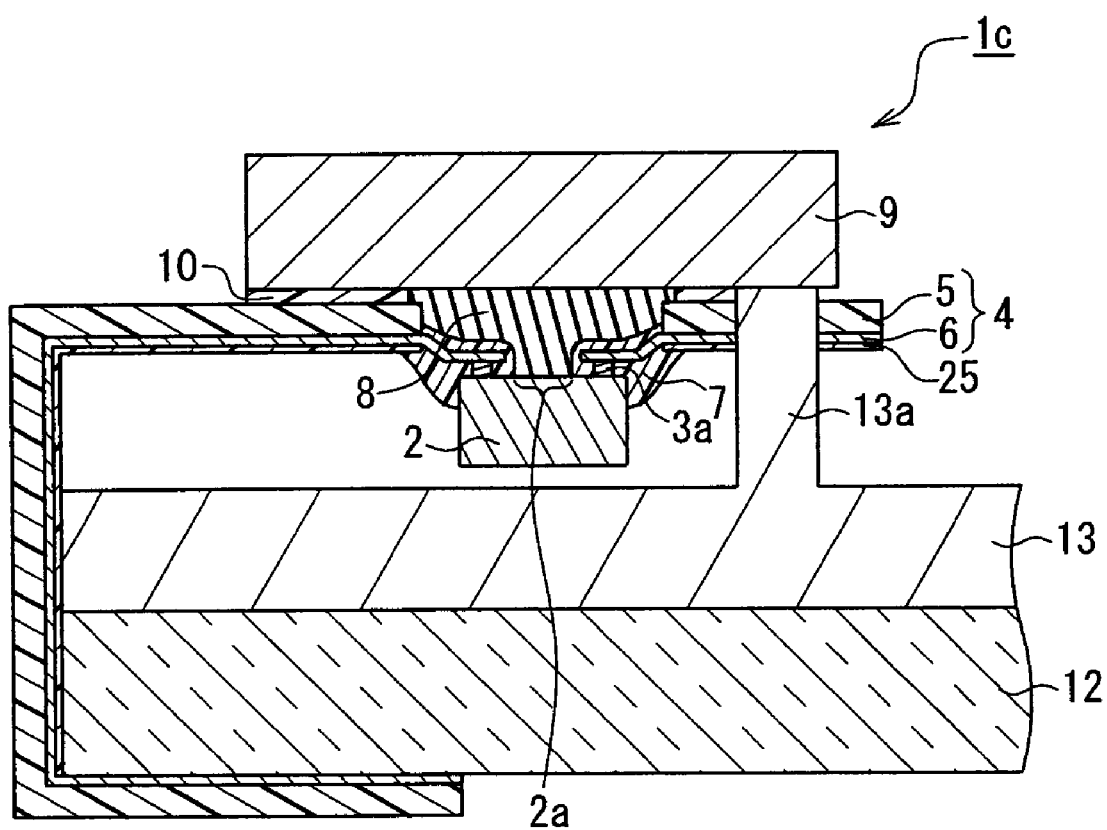
FIG. 5 is a cross-sectional view illustrating the mounting structure of the semiconductor device shown in FIG. 4.

FIG. 5 is a cross-sectional view illustrating the mounting structure of the semiconductor device 1c having the above configuration. In FIG. 5, the same reference numerals are given to the same elements as those of the mounting structure of the semiconductor device 1a shown in FIG. 2. Therefore, the same explanation will not be repeated. The circuit forming region 2a of the semiconductor element 2 is located on the surface that is opposite to the surface that faces the glass panel 12. The chassis 13 has a protruding portion 13a. The protruding portion 13a is in contact with the heat dissipating member 9, increasing the heat dissipation efficiency.

As described above, in the semiconductor device 1c according to this embodiment, the circuit forming region 2a, which generates heat, of the semiconductor element 2 and the heat dissipating member 9 for dissipating heat are coupled thermally via the filling material 8, so the heat dissipation efficiency is improved.

It is also possible to adopt a configuration in which the conductive wiring 6 connected to the protruding electrodes 3a for grounding of the semiconductor device 1c and the heat dissipating member 9 are connected by a conductive screw. This configuration allows sufficient grounding, so noise and EMI can be reduced.

Even when the configuration of the semiconductor device 1c of this embodiment is applied to structures other than TAB (Tape Automated Bonding) such as COF (Chip On Film) and BOF (Bump On Film), similar effects can be obtained.

Figure 6:
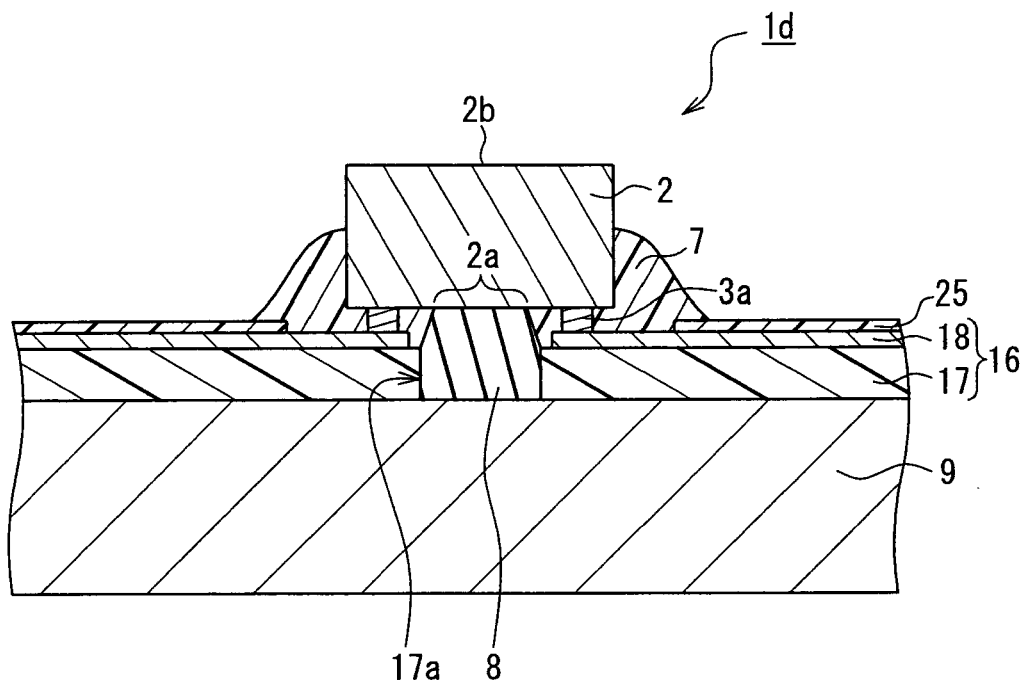
FIG. 6 is a cross-sectional view illustrating a semiconductor device in which the semiconductor device configuration according to Embodiment 2 is applied to COF.
Figure 7:
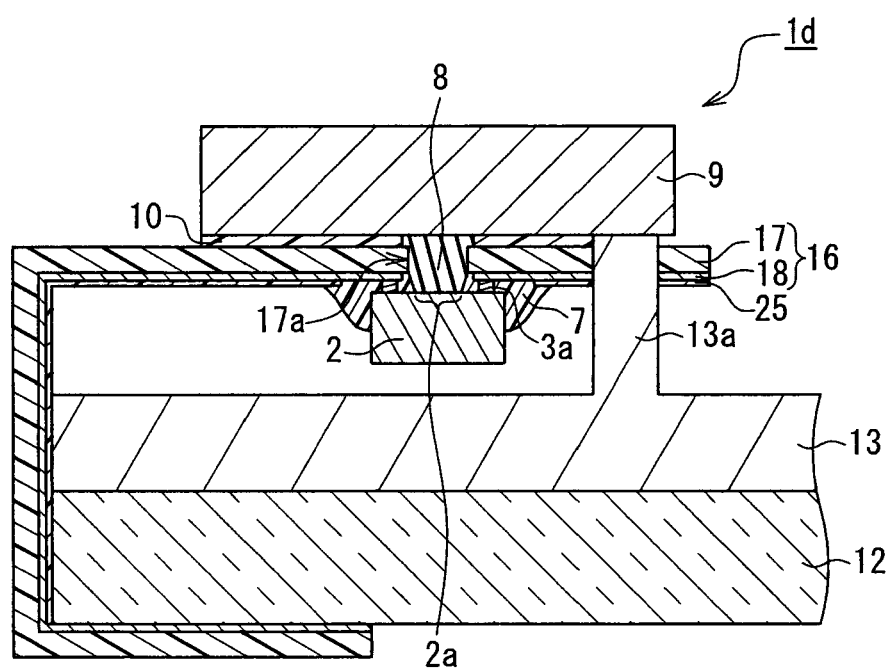
FIG. 7 is a cross-sectional view illustrating the mounting structure of the semiconductor device shown in FIG. 6.

FIG. 6 is a cross-sectional view illustrating a semiconductor device 1d in which the configuration according to Embodiment 2 is applied to COF. FIG. 7 is a cross-sectional view illustrating the mounting structure of the semiconductor device 1d. In this configuration, the same reference numerals are given to the same elements as those of the semiconductor device 1c shown in FIG. 4 and the mounting structure shown in FIG. 5. Therefore, the same explanation will not be repeated.

In a wiring board 16 for COF in this configuration, an opening 17a similar to the opening 5a of the wiring board 4 for TAB is provided in an insulating substrate 17. A conductive wiring 18 provided on the insulating substrate 17 does not extend to the inside of the opening 17a. The opening 17a is provided in the portion that faces the circuit forming region 2a of the semiconductor element 2. The filling material 8 is provided into the opening 17a to couple the circuit forming region 2a with the heat dissipating member 9, forming a heat dissipation path, and improving heat dissipation. In order to obtain sufficient heat dissipation, it is preferable that the size of the opening 17a is equal to or greater than the area of the circuit forming region 2a.

Figure 8:
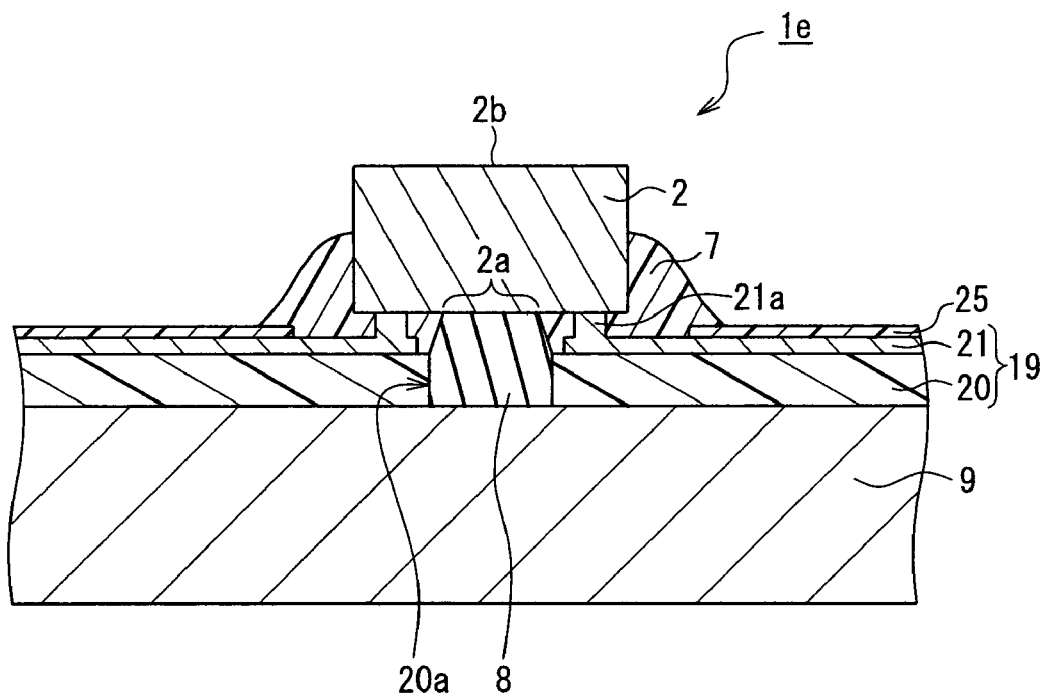
FIG. 8 is a cross-sectional view illustrating a semiconductor device in which the semiconductor device configuration according to Embodiment 2 is applied to BOF.
Figure 9:
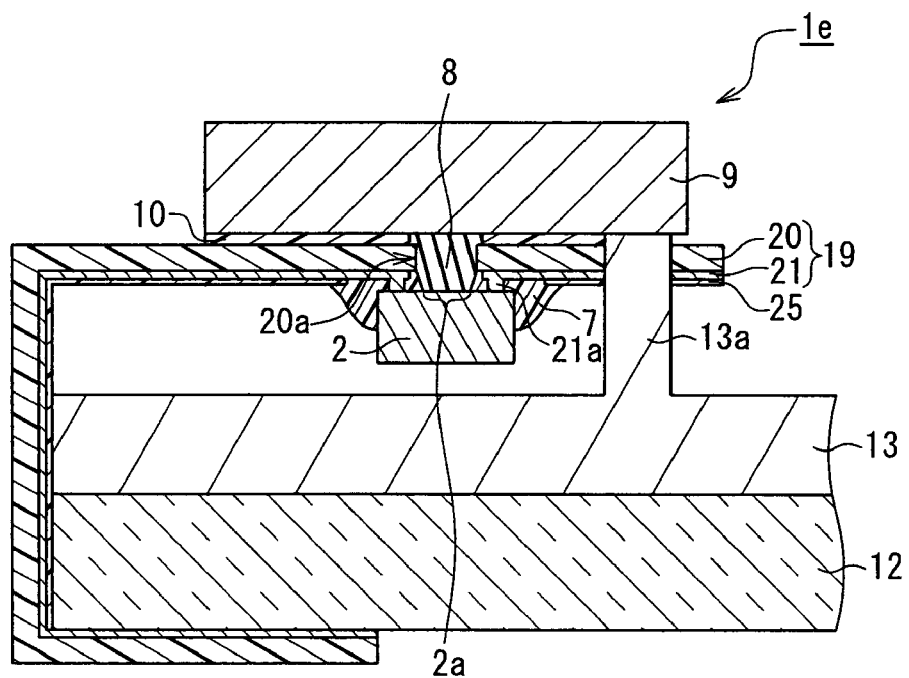
FIG. 9 is a cross-sectional view illustrating the mounting structure of the semiconductor device shown in FIG. 8.

FIG. 8 is a cross-sectional view illustrating a semiconductor device 1e in which the configuration according to Embodiment 2 is applied to BOF. FIG. 9 is a cross-sectional view illustrating the mounting structure of the semiconductor device 1e. In this configuration, the same reference numerals are given to the same elements as those of the semiconductor device 1c shown in FIG. 4 and the mounting structure shown in FIG. 5. Therefore, the same explanation will not be repeated.

In a wiring board 19 for BOF in this configuration, an opening 20a similar to the opening 5a of the wiring board 4 for TAB is provided in an insulating substrate 20. A conductive wiring 21 provided on the insulating substrate 20 does not extend to the inside of the opening 20a. Furthermore, protruding electrodes 21a are provided on the conductive wiring 21. The opening 20a is provided in the portion that faces the circuit forming region 2a of the semiconductor element 2. The filing material 8 is provided into the opening 20a to couple the circuit forming region 2a with the heat dissipating member 9, forming a heat dissipation path, and improving heat dissipation. In order to obtain sufficient heat dissipation, it is preferable that the size of the opening 20a is equal to or greater than the area of the circuit forming region 2a.

As described above, even when applied to COF and BOF, a heat dissipation efficiency can be improved, because the circuit forming region 2a, which generates heat, of the semiconductor element 2 and the heat dissipating member 9 for dissipating heat are coupled thermally via the filling material 8.

Embodiment 3

Figure 10:
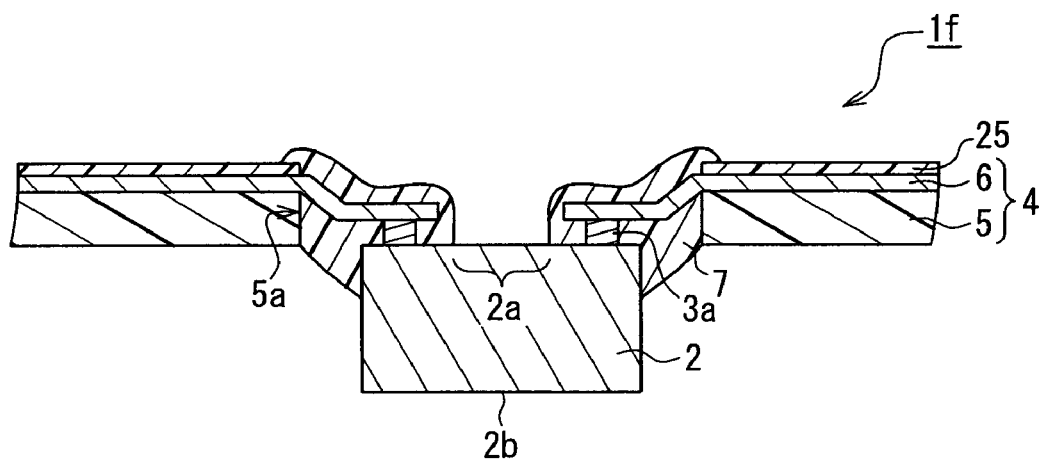
FIG. 10 is a cross-sectional view illustrating the configuration of a semiconductor device according to Embodiment 3 of the present invention.

FIG. 10 is a cross-sectional view illustrating the configuration of a semiconductor device 1f according to Embodiment 3 of the present invention. This semiconductor device 1f has a face-up structure in which the circuit forming region 2a of the semiconductor element 2 faces the surface of the wiring board 4 on which the conductive wiring 6 is not formed. This semiconductor device 1d differs from the semiconductor device 1a of Embodiment 1 in that the heat dissipating member is not attached to the surface of the wiring board 4 on which the conductive wiring 6 is formed with double-sided tape. The semiconductor device 1f has the same configuration as that of the semiconductor device 1a of Embodiment 1 except for the above-mentioned difference, so the same reference numerals are given to the same elements as those of the semiconductor device 1a. Therefore the same explanation will not be repeated.

The semiconductor element 2 is disposed inside the opening 5a of the wiring board 4, and the protruding electrodes 3a and the conductive wiring 6 are connected electrically. In order to retain electrical stability, the connected portions between the conductive wiring 6 and the protruding electrodes 3a, and the periphery of the connected portions are covered with the insulating sealing resin 7 such as an epoxy-based resin. Further, the organic insulating material 25, such as polyimide or epoxy resin, for example, is provided on one of the surfaces of the wiring board 4, so as to cover an extending portion of the conductive wiring 6. In the semiconductor device 1f, the circuit forming region 2a of the semiconductor element 2 is exposed.

Figure 11:
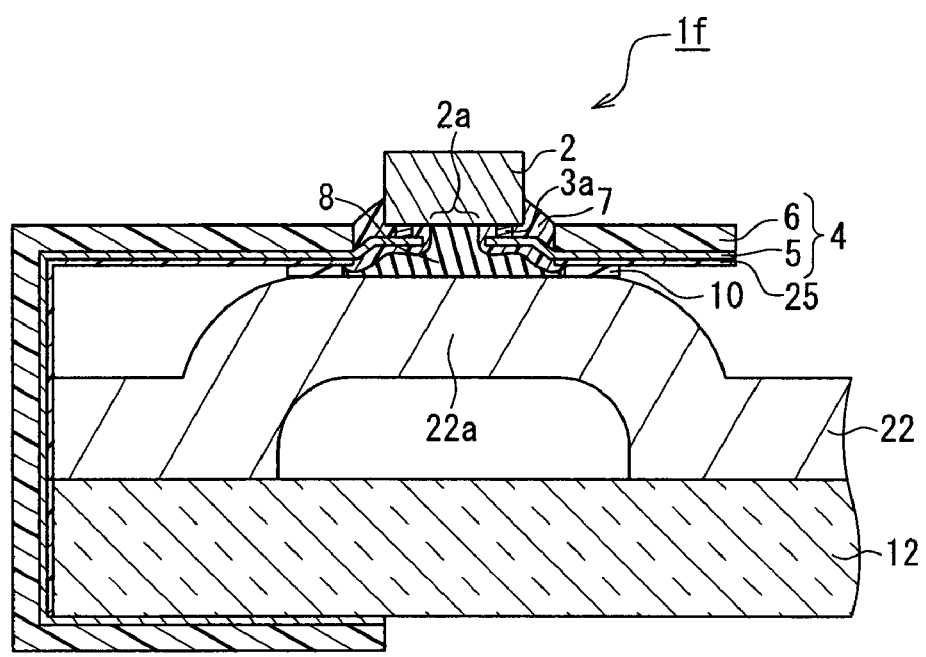
FIG. 11 is a cross-sectional view illustrating the mounting structure of the semiconductor device shown in FIG. 10.

FIG. 11 is a cross-sectional view illustrating the mounting structure of the semiconductor device 1f. A chassis 22 is disposed on the glass panel 12. The semiconductor device 1f is mounted such that the circuit forming region 2a faces the glass panel 12. The filling material 8 having a high heat conductivity is applied onto the circuit forming region 2a. Furthermore, the wiring board 4 is attached to the glass panel 12 such that this filling material 8 comes in contact with a convex portion 22a of the chassis 22. Thereby, the heat from the semiconductor element 2 can be transmitted directly to the chassis 22 without the heat dissipating member 9, which is provided in the semiconductor device 1a of Embodiment 1. Consequently, a reduction in cost can be achieved.

Furthermore, by bringing the back surface 2b of the semiconductor element 2 into contact with the heat dissipating member 9, a heat dissipating sheet, a housing, or the like, heat can be released more efficiently.

Figure 12:
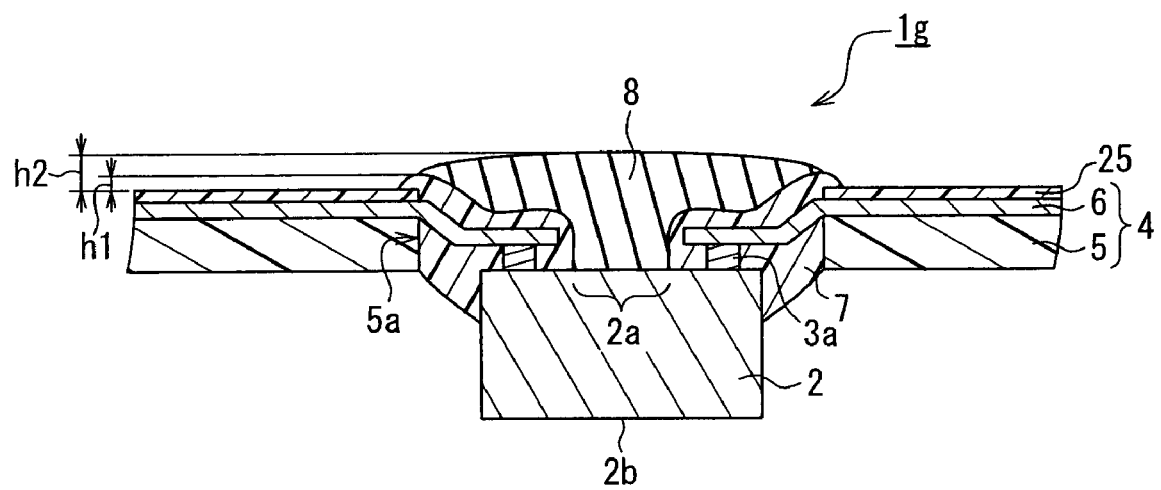
FIG. 12 is a cross-sectional view illustrating the configuration in which a filling material is filled into the semiconductor device shown in FIG. 10.

The configuration of the semiconductor device 1f shown in FIG. 10 may be modified into a semiconductor device 1g as shown in FIG. 12. That is, the filling material 8 having a high heat conductivity, or the like, is provided in advance, into the circuit forming region 2a of the semiconductor element 2 of the semiconductor device 1g. In this case, it is necessary to ensure that the filling material 8 of the circuit forming region 2a comes into contact with the chassis 22. For this reason, the filling material 8 is filled such that h1 (the height from the upper surface of the conductive wiring 6 to the upper surface of the sealing resin 7) and h2 (the height from the upper surface of the conductive wiring 6 to the upper surface of the filling material 8) satisfy the relationship: $h1 \leq h2$.

Embodiment 4

Figure 13:
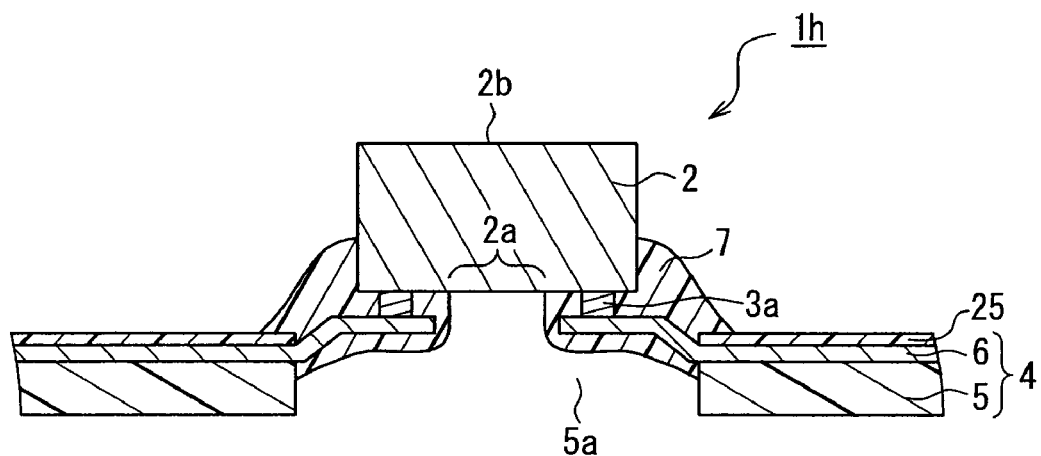
FIG. 13 is a cross-sectional view illustrating the configuration of a semiconductor device according to Embodiment 4 of the present invention.

FIG. 13 is a cross-sectional view illustrating the configuration of a semiconductor device 1h according to Embodiment 4 of the present invention. This semiconductor device 1h has a face-down structure in which the circuit forming region 2a of the semiconductor element 2 faces the surface of the wiring board 4 on which the conductive wiring 6 is formed. Also, this semiconductor device 1h differs from the semiconductor device 1c of Embodiment 2 in that the heat dissipating member is not attached to the back surface of the wiring board 4, which is opposite to the surface on which the conductive wiring 6 is formed, with double-sided tape. The semiconductor device 1h has the same configuration as that of the semiconductor device 1c of Embodiment 2 except for the above-mentioned difference, so the same reference numerals are given to the same elements as those of the semiconductor device 1c. Therefore the same explanation will not be repeated.

The semiconductor element 2 is disposed inside the opening 5a of the wiring board 4, and the protruding electrodes 3a and the conductive wiring 6 are connected electrically. In order to retain electrical stability, the connected portions between the conductive wiring 6 and the protruding electrodes 3a, and the periphery of the connected portions are covered with the insulating sealing resin 7 such as an epoxy-based resin. Further, the organic insulating material 25, such as polyimide or epoxy resin, for example, is provided on one of the surfaces of the wiring board 4, so as to cover an extending portion of the conductive wiring 6. In the semiconductor device 1h, the circuit forming region 2a of the semiconductor element 2 is exposed.

Figure 14:
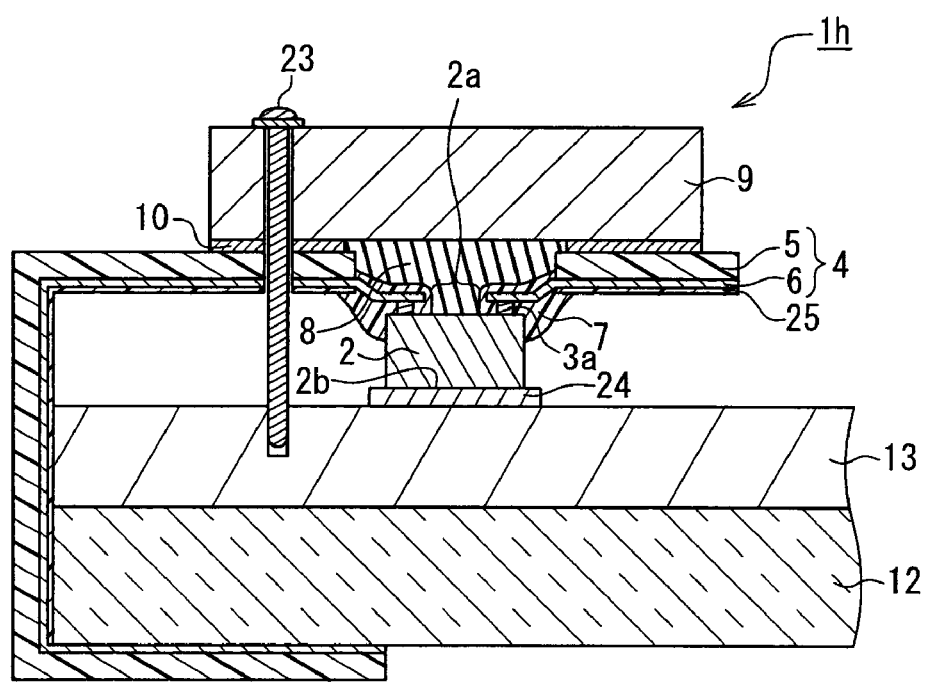
FIG. 14 is a cross-sectional view illustrating the mounting structure of the semiconductor device shown in FIG. 13.

FIG. 14 is a cross-sectional view illustrating the mounting structure of the semiconductor device 1h. The semiconductor device 1h is disposed such that the circuit forming region 2a faces the side that does not face the glass panel 12. The filling material 8, which has a high heat conductivity, or the like, is applied to the circuit forming region 2a. The heat dissipating member 9 for dissipating heat that is provided thereon is fixed to the chassis 13 with double-sided tape 10 and a screw 23, while the heat dissipating member 9 is in contact with the filling material 8, enhancing heat dissipation efficiency.

Figure 15A:
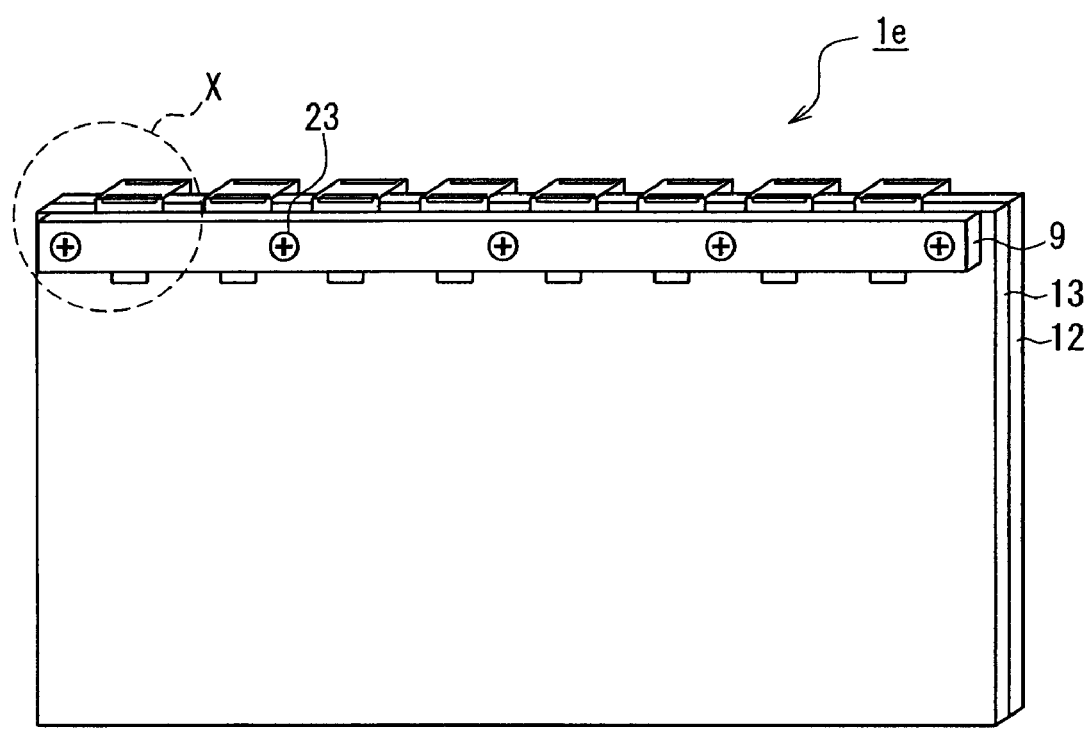
FIG. 15A is a perspective view illustrating a variation of the mounting structure of the semiconductor device shown in FIG. 13.
Figure 15B:
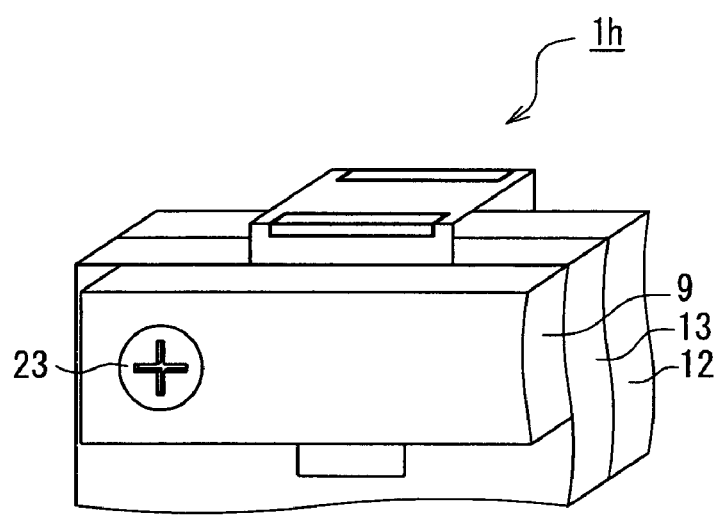
FIG. 15B is an enlarged perspective view illustrating a part of FIG. 15A.

As shown in FIG. 15A, by adopting a configuration in which the size of this heat dissipating member 9 is increased and a plurality of semiconductor devices 1h collectively are brought into contact with the heat dissipating member 9, a reduction in cost can be achieved. FIG. 15B is an enlarged view illustrating the structure of the region X surrounded by a broken line in FIG. 15A, which corresponds to the structure shown in FIG. 14.

Furthermore, by bringing the back surface 2b of the semiconductor element 2 into contact with the chassis 13 via a heat dissipating sheet 24, heat can be released more efficiently.

Figure 16:
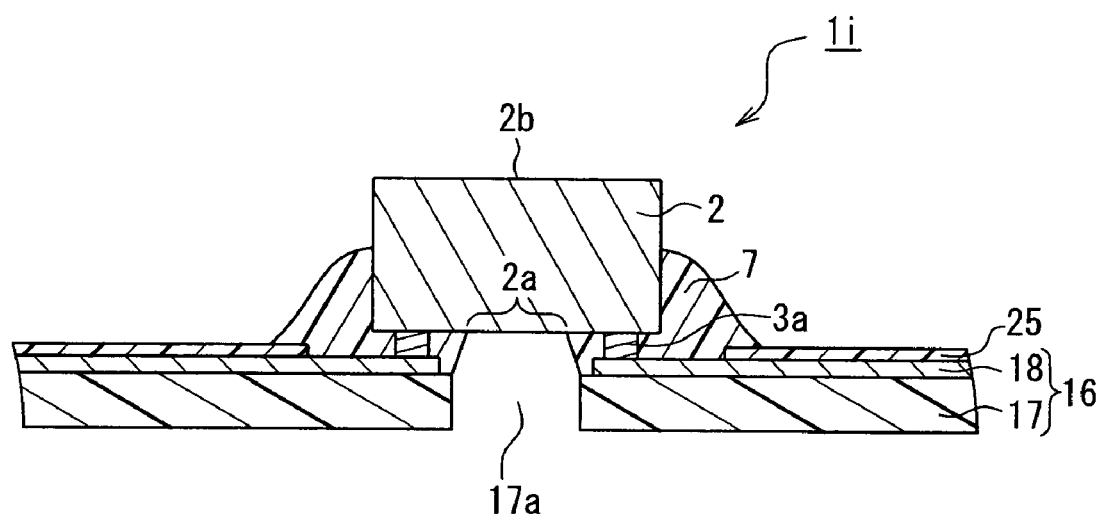
FIG. 16 is a cross-sectional view illustrating the configuration of a semiconductor device in which the semiconductor device configuration according to Embodiment 4 is applied to COF.
Figure 17:
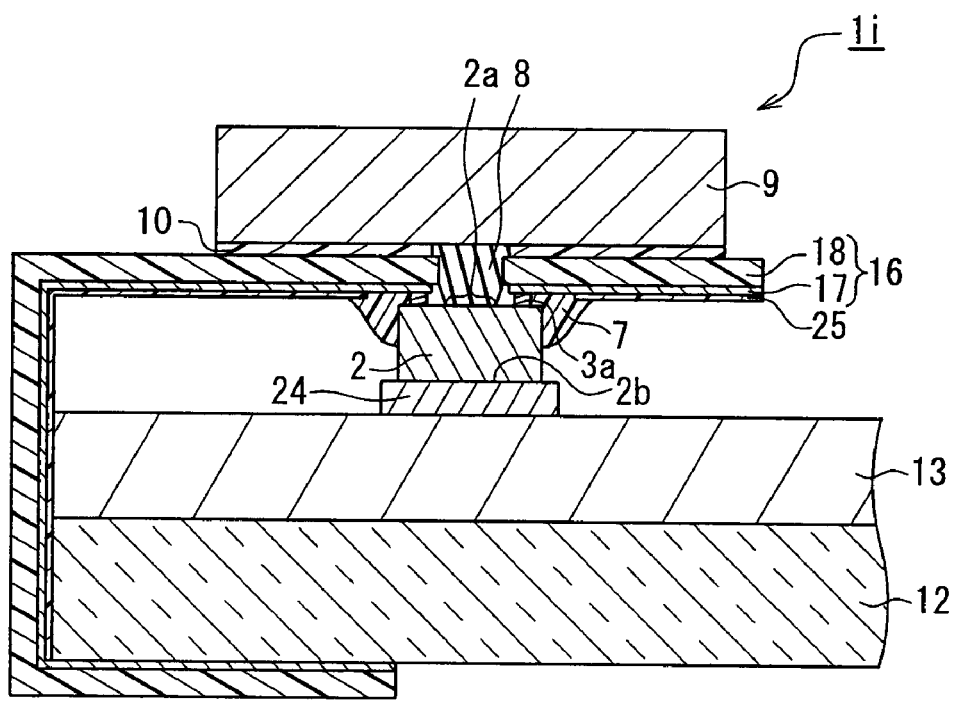
FIG. 17 is a cross-sectional view illustrating the mounting structure of the semiconductor device shown in FIG. 16.

FIG. 16 is a cross-sectional view illustrating the configuration of a semiconductor device 1i in which the configuration according to Embodiment 4 is applied to COF. FIG. 17 is a cross-sectional view illustrating the mounting structure of the semiconductor device 1i. In this configuration, the same reference numerals are given to the same elements as those of the semiconductor device 1d shown in FIG. 6 and the mounting structure shown in FIG. 7. Therefore the same explanation will not be repeated.

Figure 18:
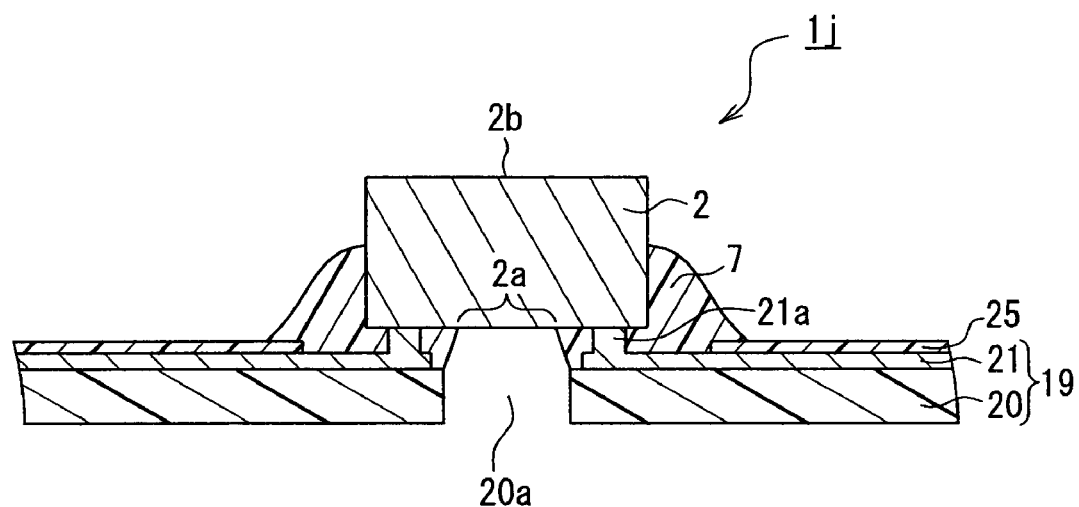
FIG. 18 is a cross-sectional view illustrating the configuration of a semiconductor device in which the semiconductor device configuration according to Embodiment 4 is applied to BOF.
Figure 19:
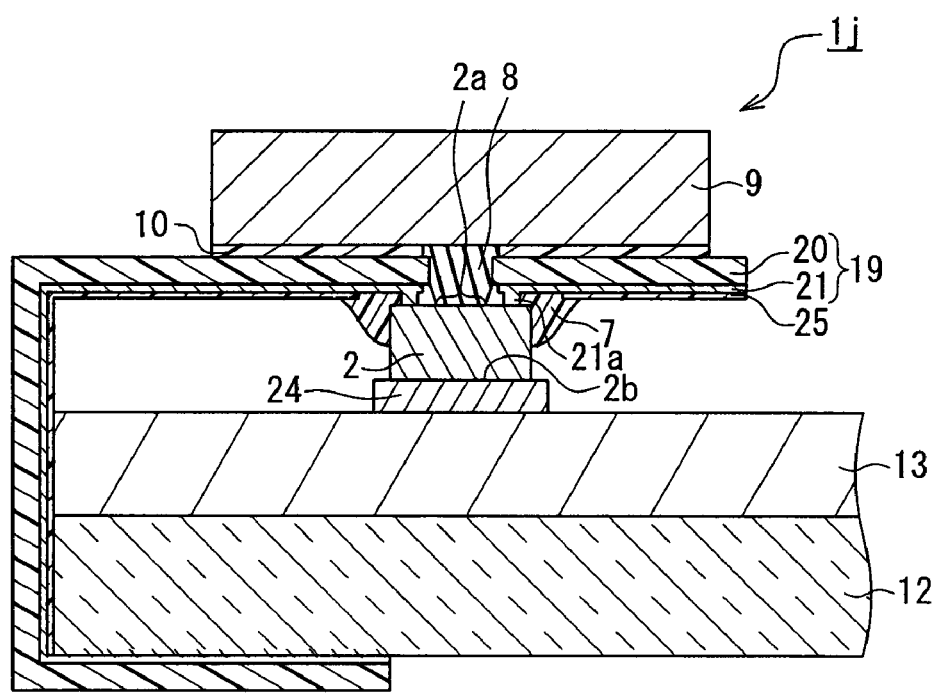
FIG. 19 is a cross-sectional view illustrating the mounting structure of the semiconductor device shown in FIG. 18.

FIG. 18 is a cross-sectional view illustrating the configuration of a semiconductor device 1j in which the configuration according to Embodiment 4 is applied to BOF. FIG. 19 is a cross-sectional view illustrating the mounting structure of the semiconductor device 1j. In this configuration, the same reference numerals are given to the same elements as those of the semiconductor device 1e shown in FIG. 8 and the mounting structure shown in FIG. 9. Therefore the same explanation will not be repeated.

As described above, even when applied to COF and BOF, heat dissipation efficiency can be improved, because the circuit forming region 2a, which generates heat, of the semiconductor element 2 and the heat dissipating member 9 for dissipating heat are coupled thermally via the filling material 8 having a high heat conductivity.

Also, even in COF and BOF, by bringing the filling material 8 into contact with the chassis 13, the heat from the semiconductor element 2 can be transmitted directly to the chassis 13 without the heat dissipating member 9, which is provided in the semiconductor device 1a of Embodiment 1. Consequently, a reduction in cost can be achieved.

Embodiments 1 to 4 described above can be selected according to the mounting structure of the semiconductor device to be set, so the present invention is highly versatile.

It should be noted that, in Embodiments 1 to 4, the material for transmitting heat is not limited to the filling material 8 as described above, and it is possible to use, instead of the filling material 8, any material that has a heat conductivity higher than that of the sealing resin, is viscous, and can come into tight contact with the heat dissipating member 9.

It should also be noted that the bonding method for bonding the heat dissipating member 9 and the wiring board 4 or the conductive wiring 6 is not limited to the double-sided tape 10, and other elements that can bond the heat dissipating member 9 and the wiring board 4 or the conductive wiring 6 can be used instead of the double-sided tape 10.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   a wiring board in which a conductive wiring is formed on an insulating substrate having an opening;
   a semiconductor element that has a circuit forming region and an electrode pad, and is mounted on the wiring board with the circuit forming region facing the opening, the electrode pad being connected electrically to the conductive wiring via a protruding electrode;
   a sealing resin that partially covers the connected portion between the electrode pad and the conductive wiring;
   a heat dissipating member that is disposed so as to have a portion facing the opening and the element; and
   a filling material that has a heat conductivity higher than that of the sealing resin, and is filled into the opening, so as to be in contact with the circuit forming region of the semiconductor element and the heat dissipating member.

2. The semiconductor device according to claim 1, wherein the heat dissipating member is a sheet.

3. The semiconductor device according to claim 1, wherein the heat dissipating member is a metal plate.

4. The semiconductor device according to claim 1, wherein the heat dissipating member is made of a material having a heat conductivity higher than that of the filling material.

5. The semiconductor device according to claim 1, wherein the filling material is any one of a solder alloy, resin, a resin containing a metal, silicone, rubber, and a resin containing inorganic particles.

6. The semiconductor device according to claim 1, wherein the circuit forming region is provided with an insulating protective film.

* * * * *